United States Patent
Seo (10) Patent No.: US 7,633,822 B2
(45) Date of Patent: Dec. 15, 2009

(54) CIRCUIT AND METHOD FOR CONTROLLING SENSE AMPLIFIER OF A SEMICONDUCTOR MEMORY APPARATUS

(75) Inventor: Ju-Young Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 30 days.

(21) Appl. No.: 11/822,816

(22) Filed: Jul. 10, 2007

(65) Prior Publication Data
US 2008/0123453 A1 May 29, 2008

(30) Foreign Application Priority Data
Nov. 23, 2006 (KR) ...................... 10-2006-0116318

(51) Int. Cl.
*G11C 7/02* (2006.01)
(52) U.S. Cl. ............. 365/208; 365/189.07; 365/189.09; 365/210.1; 365/205
(58) Field of Classification Search ................. 365/208, 365/189.07, 189.09, 210.1, 205
See application file for complete search history.

(56) References Cited

U.S. PATENT DOCUMENTS

| | | | | |
|---|---|---|---|---|
| 4,980,799 A * | 12/1990 | Tobita | | 361/311 |
| 5,023,840 A * | 6/1991 | Tobita | | 365/201 |
| 5,132,932 A * | 7/1992 | Tobita | | 365/222 |
| 5,657,282 A * | 8/1997 | Lee | | 365/201 |
| 5,764,580 A * | 6/1998 | Suzuki et al. | | 365/205 |
| 5,966,337 A | 10/1999 | Lee et al. | | |
| 6,021,082 A * | 2/2000 | Shirai | | 365/226 |
| 6,031,781 A * | 2/2000 | Tsuji et al. | | 365/189.08 |
| 6,043,685 A | 3/2000 | Lee | | |
| 6,097,653 A | 8/2000 | Park | | |
| 6,115,316 A * | 9/2000 | Mori et al. | | 365/230.03 |
| 6,347,058 B1 | 2/2002 | Houghton et al. | | |
| 6,707,728 B2 * | 3/2004 | Lee | | 365/194 |
| 6,845,050 B2 * | 1/2005 | Lee | | 365/194 |
| 6,922,098 B2 * | 7/2005 | Choi et al. | | 327/538 |
| 6,996,018 B2 * | 2/2006 | Yun | | 365/205 |
| 7,102,953 B2 * | 9/2006 | Kono et al. | | 365/226 |
| 7,149,131 B2 * | 12/2006 | Choi et al. | | 365/189.09 |
| 7,292,090 B2 * | 11/2007 | Lee et al. | | 327/536 |
| 7,304,902 B2 * | 12/2007 | Park et al. | | 365/203 |
| 7,362,167 B2 * | 4/2008 | Park et al. | | 327/543 |
| 7,382,677 B2 * | 6/2008 | Lee et al. | | 365/226 |
| 7,450,455 B2 * | 11/2008 | Kang et al. | | 365/208 |

(Continued)

FOREIGN PATENT DOCUMENTS

JP 10340583 12/1998

(Continued)

*Primary Examiner*—Viet Q Nguyen
(74) *Attorney, Agent, or Firm*—Venable LLP; Jeffri A. Kaminski (57) ABSTRACT

A sense amplifier control unit include: a control unit that detects a variation in the level of an external voltage and outputs a delay time selection signal on the basis of the result of the detection. A variable delay unit delays an active signal by a delay time corresponding to the delay time selection signal and outputs the delayed signal. A driving signal generating unit outputs a driving signal according to the output of the variable delay unit. A sense amplifier driver drives a sense amplifier on the basis of the driving signal.

19 Claims, 8 Drawing Sheets

U.S. PATENT DOCUMENTS

| | | | |
|---|---|---|---|
| 7,502,268 B2 * | 3/2009 | Choi et al. | 365/201 |
| 2006/0092743 A1 * | 5/2006 | Choi et al. | 365/226 |

FOREIGN PATENT DOCUMENTS

| | | |
|---|---|---|
| JP | 2000-285672 | 10/2000 |
| KR | 1020050090911 | 9/2005 |
| KR | 10-2006-0112134 | 11/2006 |

* cited by examiner

FIG. 1

Related Art

FIG. 2

Related Art

Related Art

CIRCUIT AND METHOD FOR CONTROLLING SENSE AMPLIFIER OF A SEMICONDUCTOR MEMORY APPARATUS

CROSS-REFERENCE TO RELATED PATENT APPLICATION

This application claims the benefit of Korean Patent Application No. 10-2006-0116318, filed on Nov. 23, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a circuit and method for controlling a sense amplifier of a semiconductor memory apparatus.

2. Related Art

Semiconductor memory apparatuses include sense amplifiers for amplifying a minute voltage difference between a bit line and a bit bar (/bit) line in a core area and reading data recorded on corresponding memory cells and control circuits for controlling the operation of the sense amplifiers.

Figure 1:
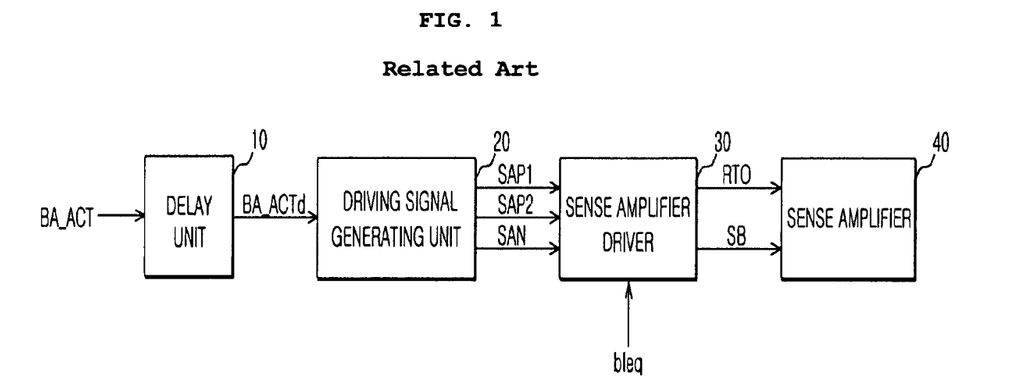
FIG. 1 is a block diagram illustrating a sense amplifier control circuit of a semiconductor memory apparatus according to the related art.

As shown in FIG. 1, a sense amplifier control circuit of a semiconductor memory apparatus according to the related art includes: a delay unit 10 that delays a bank active signal BA_ACT by a predetermined delay time td and outputs the delayed signal; a driving signal generating unit 20 that generates driver driving signals SAP1, SAP2, and SAN for determining the operation timing of a sense amplifier driver 30 according to an output signal BA_ACTd of the delay unit 10; and the sense amplifier driver 30 that outputs sense amplifier driving signals RTO and SB according to the driver driving signals SAP1, SAP2, and SAN to drive a sense amplifier 40.

The delay time of the delay unit 10 is determined when a circuit is designed, and has a fixed value.

Figure 2:
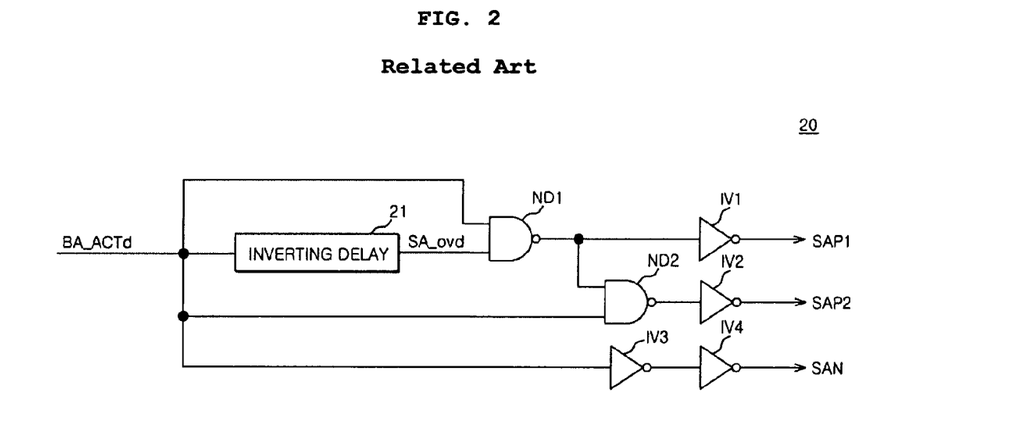
FIG. 2 is a circuit diagram illustrating a driving signal generating unit shown in FIG. 1.

As shown in FIG. 2, the driving signal generating unit 20 includes: an inverting delay 21 that receives the bank active signal BA_ACT; a first NAND gate ND1 that receives the bank active signal BA_ACT and an output signal SA_ovd of the inverting delay 21; a first inverter IV1 that receives the output of the first NAND gate ND1 and outputs the driver driving signal SAP1; a second NAND gate ND2 that receives the output of the first NAND gate ND1 and the bank active signal BA_ACT; a second inverter IV2 that receives the output of the second NAND gate ND2 and outputs the driver driving signal SAP2; a third inverter IV3 that receives the bank active signal BA_ACT; and a fourth inverter IV4 that receives the output of the third inverter IV3 and outputs the driver driving signal SAN.

Figure 3:
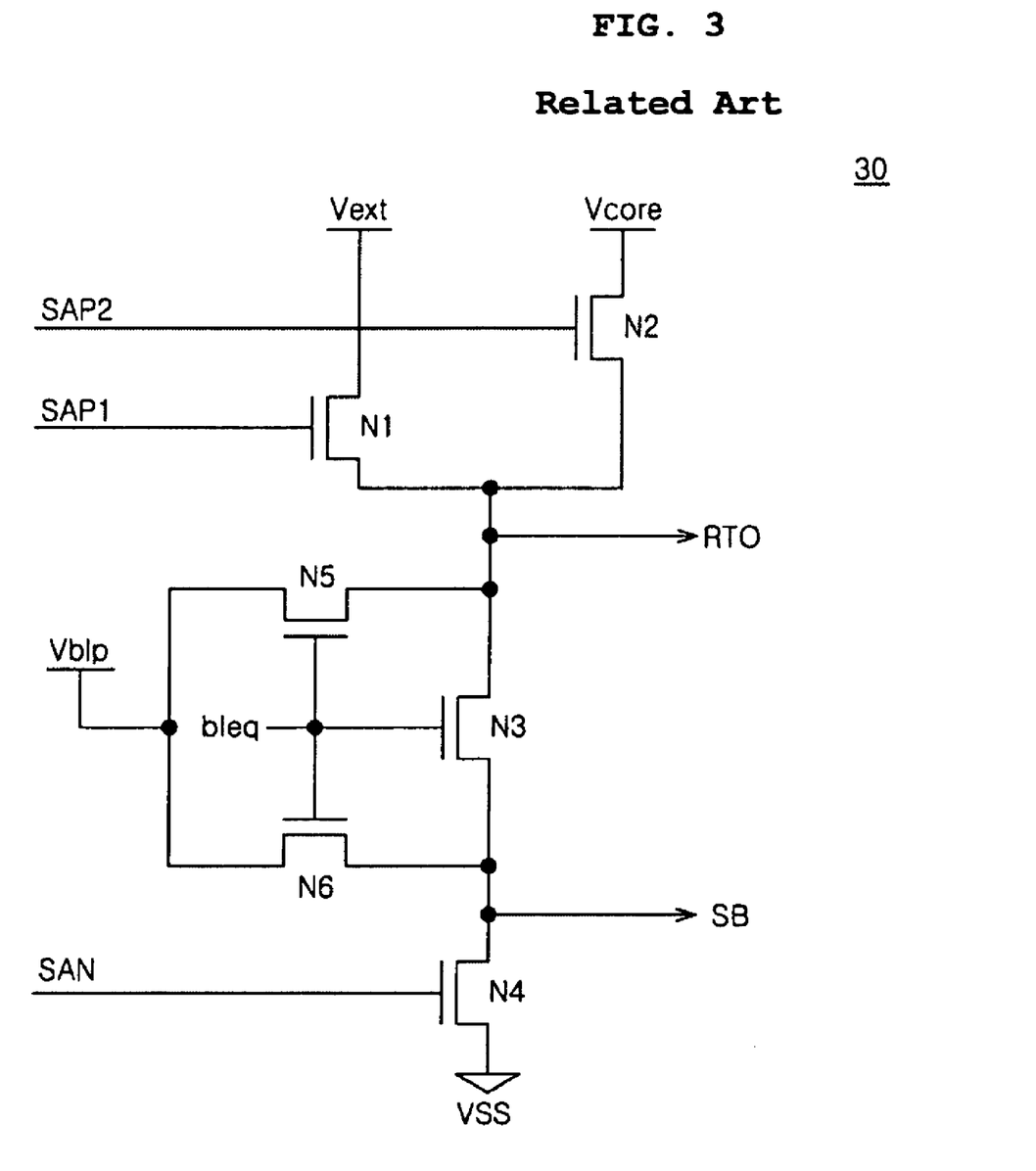
FIG. 3 is a circuit diagram illustrating a sense amplifier driver shown in FIG. 1.

As shown in FIG. 3, the sense amplifier driver 30 includes: a first transistor N1 having a source to which an external voltage Vext is applied and a gate to which the driver driving signal SAP1 is input; a second transistor N2 having a source to which a core voltage Vcore is applied and a gate to which the driver driving signal SAP2 is input; a third transistor N3 having a source that is connected to the drains of the first and second transistors N1 and N2; a fourth transistor N4 having a source connected to a drain of the third transistor N3, a gate to which the driver driving signal SAN is input, and a drain connected to the ground; a fifth transistor N5 having a drain connected to a node between the first transistor N1 and the third transistor N3; and a sixth transistor N6 having a drain connected to a node between the third transistor N3 and the fourth transistor N4. A bit line equalizing signal bleq is input to the gates of the third, fifth, and sixth transistors N3, N5, and N6. A bit line precharge voltage Vblp is applied to the sources of the fifth and sixth transistors N5 and N6. The sense amplifier driving signals RTO and SB are output from a node between the first transistor N1 and the fifth transistor N5 and a node between the fourth transistor N4 and the sixth transistor N6, respectively.

Figure 4:
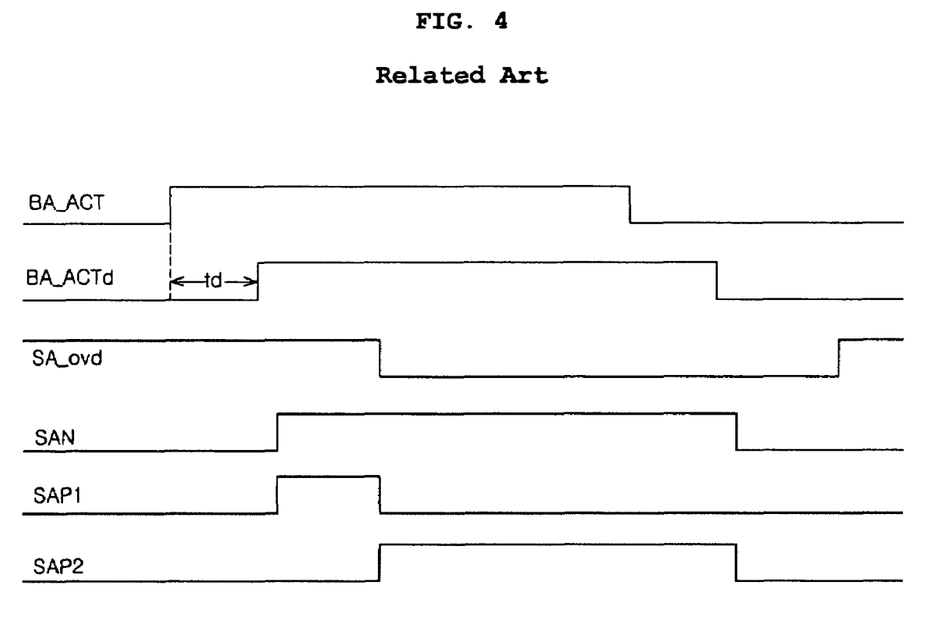
FIG. 4 is a timing chart illustrating the operation of the sense amplifier control circuit of the semiconductor memory apparatus according to the related art.

Next, the operation of the sense amplifier control circuit of the semiconductor memory apparatus according to the related art will be described with reference to FIG. 4.

When the bank active signal BA_ACT is activated at a high level, the output signal BA_ACTd of the delay unit 10 is activated at a high level after the elapse of the delay time td. The delay time td has a fixed value.

When the output signal BA_ACTd of the delay unit 10 is activated at the high level, the driving signal generating unit 20 activates the driver driving signals SAN and SAP1 at a high level and outputs the activated signals.

Since the output signal BA_ACTd of the delay unit 10 is activated at the high level, the driver driving signal SAP1 is inactivated at a low level according to an output signal SA_ovd of the inverting delay 21 of the driving signal generating unit 20, and the driver driving signal SAP2 is activated at a high level.

When the bank active signal BA_ACT is inactivated at a low level, the driver driving signals SAN and SAP2 are inactivated at a low level.

The sense amplifier driver 30 outputs the sense amplifier driving signals RTO and SB according to the driver driving signals SAP1, SAP2, and SAN to drive the sense amplifier 40.

That is, the semiconductor memory apparatus does not perform an active operation (for example, reading) during a precharge period for which the bank active signal BA_ACT is at a low level. Therefore, the bit line precharge voltage Vblq is used to maintain the bit line and the bit bar line at the same level.

Since all of the driver driving signals SAP1, SAP2, and SAN are at low levels during the precharge period, the first, second, and fourth transistors N1, N2, and N4 are turned off, so that the operation of the sense amplifier 30 stops.

Meanwhile, the semiconductor memory apparatus performs an active operation (for example, reading) during an active period for which the bank active signal BA_ACT is at a high level. Therefore, the bit line equalizing signal bleq is inactivated at a low level, and the third, fifth, and sixth transistors N3, N5, and N6 are turned off. As shown in FIG. 4, when the driver driving signals SAP1, SAP2, and SAN are activated at predetermined timings, the first, second, and fourth transistors N1, N2, and N4 are turned on. Then, the sense amplifier driver 30 operates to output the sense amplifier driving signals RTO and SB.

The sense amplifier control circuit of the semiconductor memory apparatus according to the related art has the following problems because it drives the sense amplifier to perform a data sensing operation at a fixed delay timing.

First, when an external voltage level is higher than a reference voltage level that is set on the basis of the delay value, a signal waveform varies rapidly. However, the driver driving signal of the driving signal generating unit 20 does not correspond to the rapid variation in the signal waveform, but is generated at a predetermined timing. Therefore, the sense amplifier driving signal of the sense amplifier driver 30 is also generated at a delayed timing, such that the sense amplifier 40 has an insufficient data sensing time, which causes a data sensing error.

Second, when the external voltage level is lower than the reference voltage level that is set on the basis of the delay value, a signal waveform varies slowly. However, the driver driving signal of the driving signal generating unit 20 does not correspond to the slow variation in the signal waveform, but is generated at a predetermined timing. Therefore, the sense amplifier driving signal of the sense amplifier driver 30 is also generated at the timing earlier than the predetermined timing, so that the sense amplifier 40 has an unnecessary extra data sensing time, which causes a data sensing error in the semiconductor memory apparatus.

SUMMARY OF THE INVENTION

One embodiment may provide a circuit and method for controlling a sense amplifier of a semiconductor memory apparatus to perform a data sensing operation at optimum timing, while corresponding to a variation in the level of an external voltage.

According to one embodiment, a sense amplifier control circuit of a semiconductor memory apparatus may include: a control unit that may detect a variation in the level of an external voltage and output a delay time selection signal on the basis of the result of the detection; a variable delay unit that may delay an bank active signal by a delay time corresponding to the delay time selection signal and outputs the delayed signal; a driving signal generating unit that may output a driving signal according to the output of the variable delay unit; and a sense amplifier driver that may drive a sense amplifier on the basis of the driving signal.

According to another embodiment, a method may be provided for controlling a sense amplifier in a semiconductor memory apparatus. The method may include: detecting the level of an external voltage; delaying an bank active signal by a time corresponding to the detection result of the external voltage level; and generating a driving signal for driving a sense amplifier on the basis of the delayed bank active signal.

DESCRIPTION OF EXEMPLARY EMBODIMENT

Embodiments of a method and circuit for controlling a sense amplifier of a semiconductor memory will now be described in detail with reference to the accompanying drawings.

Figure 5:
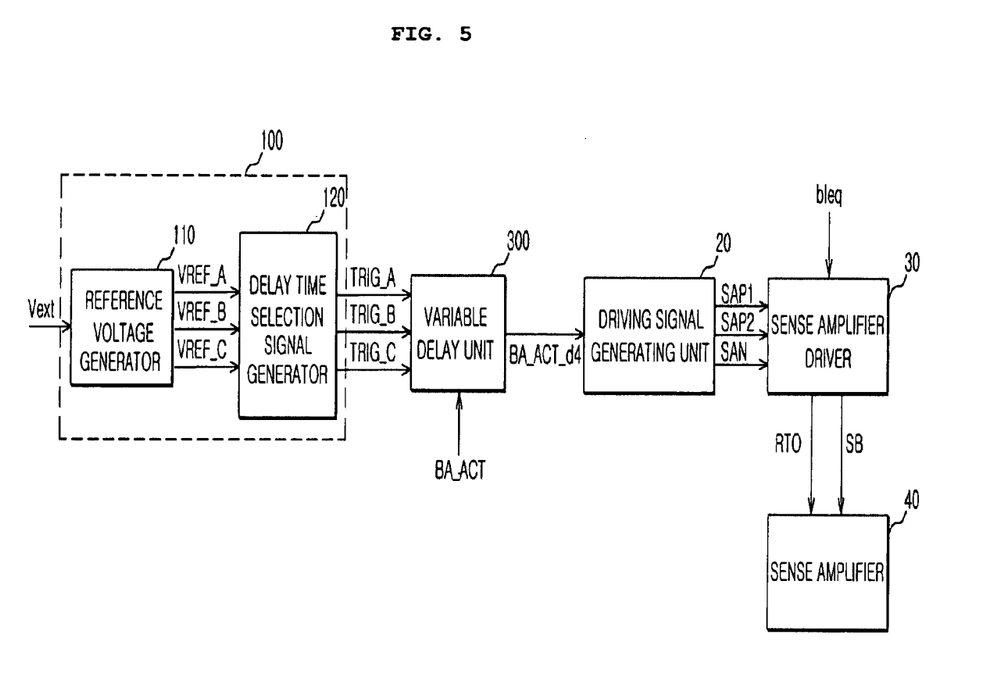
FIG. 5 is an exemplary block diagram illustrating a sense amplifier control circuit of a semiconductor memory apparatus according to one embodiment.

As shown in FIG. 5, a sense amplifier control circuit of a semiconductor memory apparatus according to one embodiment may include: a control unit 100 that may detect a variation in the level of an external voltage Vext and output delay time selection signals TRIG_A, TRIG_B, and TRIG_C on the basis of the detection result; a variable delay unit 300 that may delay an bank active signal BA_ACT by a delay time corresponding to the delay time selection signals TRIG_A, TRIG_B, and TRIG_C and output the delayed signal; a driving signal generating unit 20 that may output driver driving signals SAP1, SAP2, and SAN in response to an output signal BA_ACT_d4 of the variable delay unit 300; and a sense amplifier driver 30 that may output sense amplifier driving signals RTO and SB in response to the driver driving signals SAP1, SAP2, and SAN to drive a sense amplifier 40.

The control unit 100 may include a reference voltage generator 110 that may use the external voltage Vext to output a plurality of reference voltages VREF_A, VREF_B, and VREF_C and a delay time selection signal generator 120 that may selectively activate the delay time selection signals TRIG_A, TRIG_B, and TRIG_C according to the levels of the reference voltages VREF_A, VREF_B, and VREF_C and output the activated signals.

Figure 6:
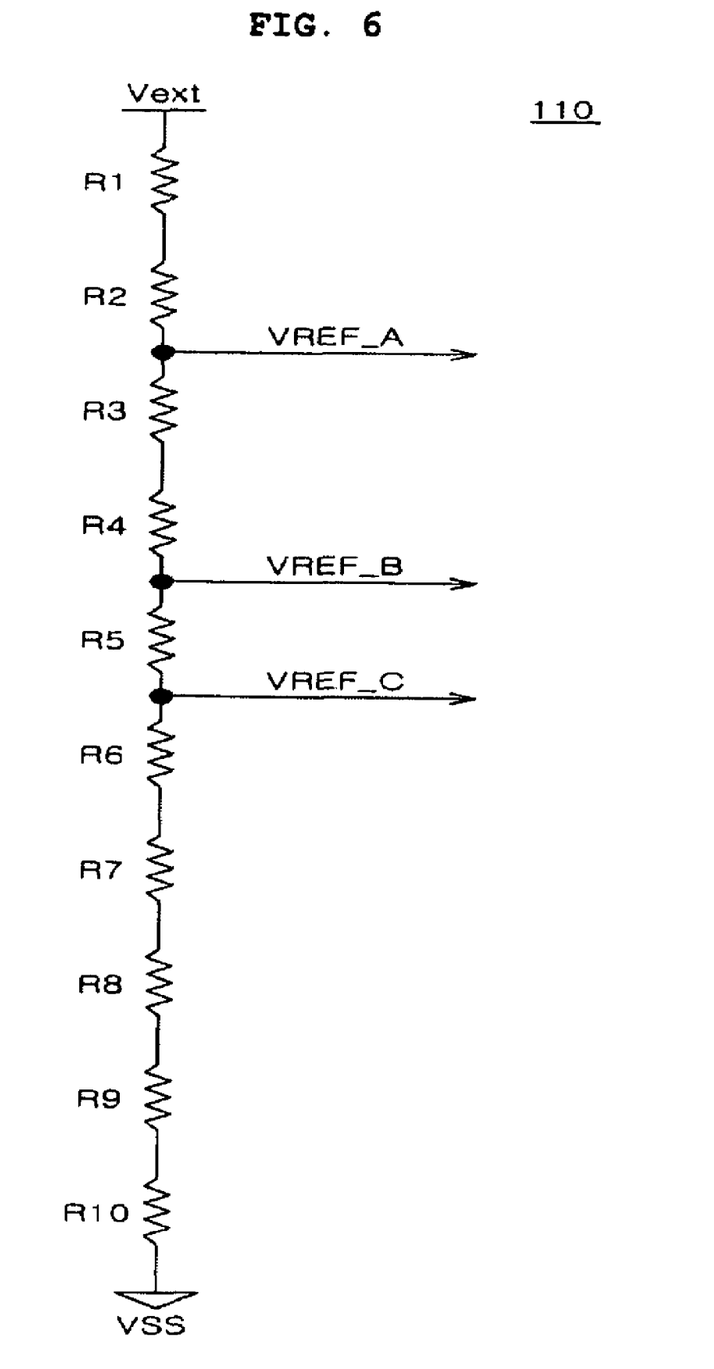
FIG. 6 is an exemplary circuit diagram illustrating a reference voltage generator shown in FIG. 5.

As shown in FIG. 6, the reference voltage generator 110 may include a plurality of resistors R1 to R10 connected between an external voltage terminal Vext and a ground terminal VSS, and may divide the external voltage Vext into the plurality of reference voltages VREF_A, VREF_B, and VREF_C at the resistance ratio of predetermined nodes among the plurality of resistors R1 to R10 and then output the divided reference voltages VREF_A, VREF_B, and VREF_C. The plurality of resistors R1 to R10 may have the same reference value. According to the voltage divide theory, among the plurality of reference voltages VREF_A, VREF_B, and VREF_C, the reference voltage VREF_A may have the highest level (8/10*Vext), followed by the reference voltages VREF_B (6/10*Vext) and VREF_C (5/10*Vext) in this order.

Figure 7:
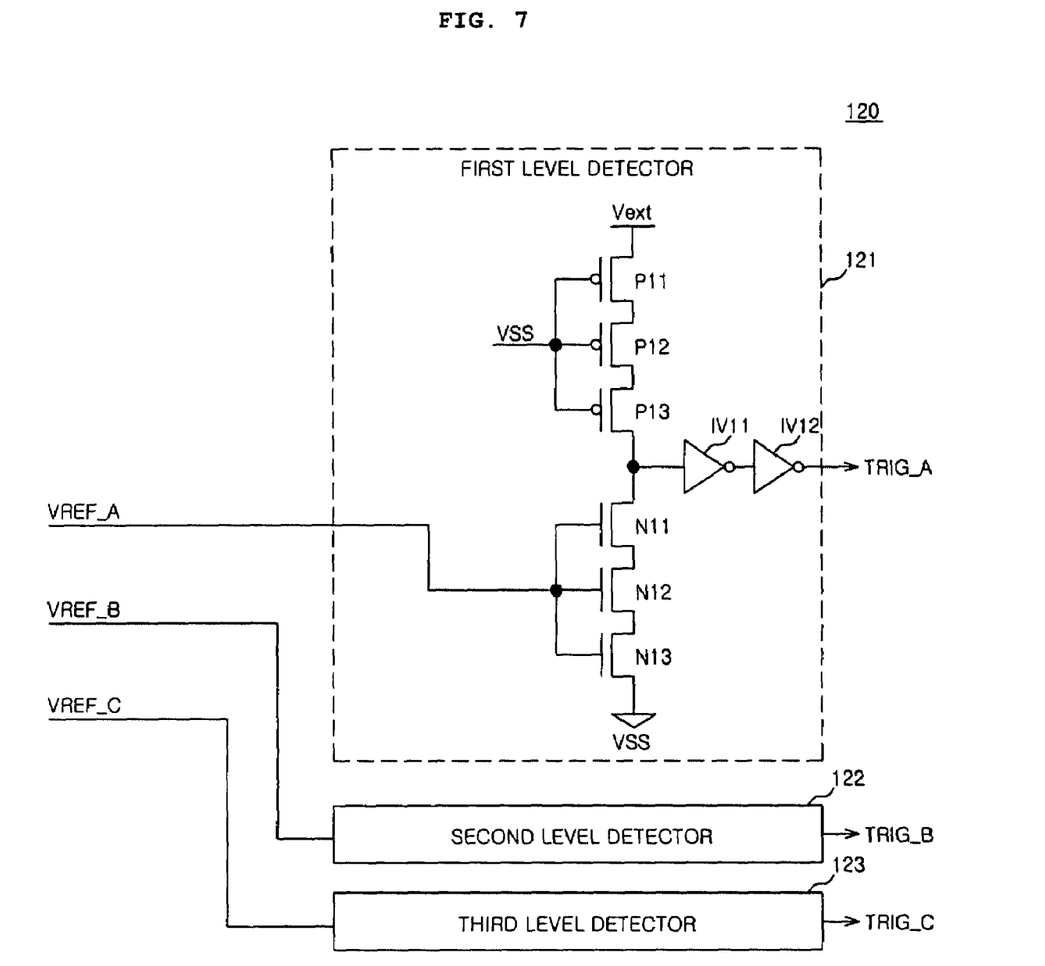
FIG. 7 is an exemplary circuit diagram illustrating a level detector shown in FIG. 5.

As shown in FIG. 7, the delay time selection signal generator 120 may include first to third level detectors 121 to 123. The first to third level detectors 121 to 123 may be supplied with the plurality of reference voltages VREF_A, VREF_B, and VREF_C, respectively. When the levels of the reference voltages input to the first to third level detectors 121 to 123 are equal to or higher than a predetermined reference level Vx, the first to third level detectors 121 to 123 may activate the delay time selection signals TRIG_A, TRIG_B, and TRIG_C and output the activated signals, respectively. The reference level Vx may be set on the basis of the level of a normal external voltage Vext.

The first level detector 121 may include a plurality of first P-type transistors P11 to P13 that may be connected to the external voltage terminal Vext, a plurality of second N-type transistors N11 to N13 that may be connected between the first transistors P11 to P13 and the ground terminal VSS and may have gates supplied with the reference voltage VREF_A, a first inverter IV11 that may be supplied with the voltage levels of nodes between the first transistors P11 to P13 and the second transistors N11 to N13, and a second inverter IV12 that may receive the output of the first inverter IV11. The first transistors P11 to P13 may have the same size, and the gates of the first transistors P11 to P13 may be connected to the ground terminal VSS. The second transistors N11 to N13 may have the same size.

When the reference voltage VREF_A increases to be equal to or higher than the reference level Vx, the second transistors N11 to N13 may be turned on. When the second transistors N11 to N13 are turned on, the delay time selection signal TRIG_A may be activated at a low level by the second inverter IV12.

The first level detector 121 may adjust the reference level Vx to a desired level by adjusting the sizes of the first transistors P11 to P13 and the second transistors N11 to N13.

The second and third level detectors 122 and 123 may have the same structure as the first level detector 121, and may set the reference voltage Vx in the same manner as that in which the first level detector 121 sets the reference voltage Vx.

Figure 8:
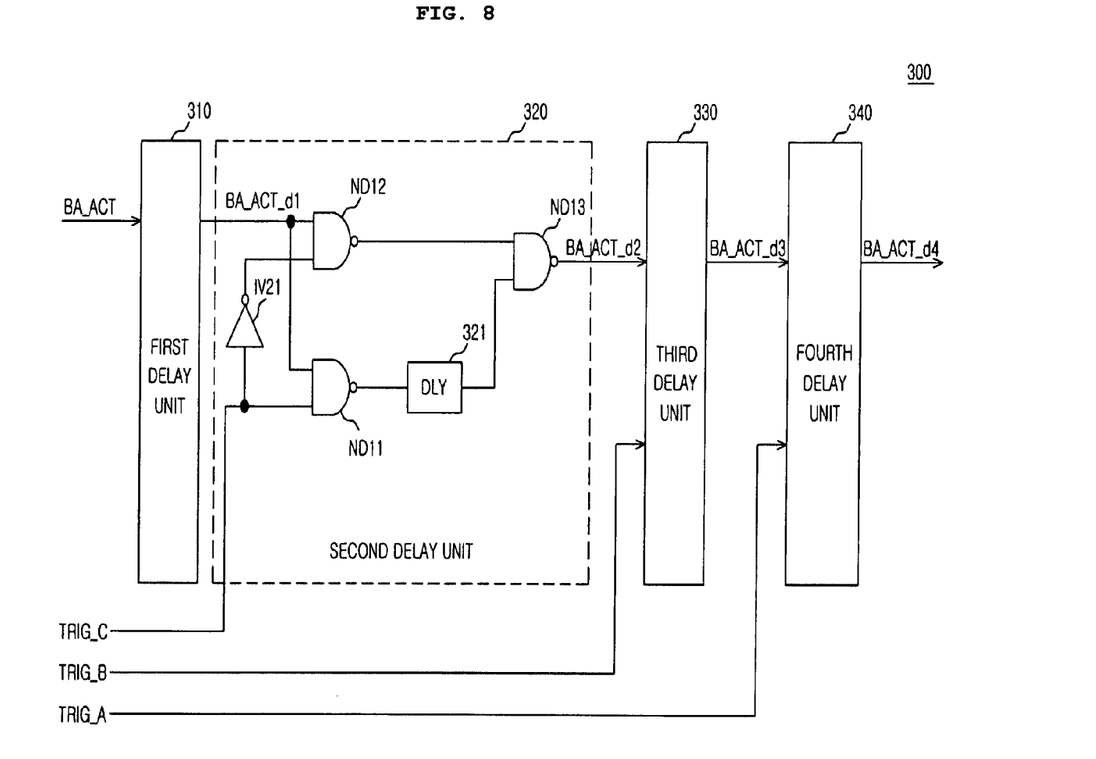
FIG. 8 is an exemplary circuit diagram illustrating a variable delay unit shown in FIG. 5.

As shown in FIG. 8, the variable delay unit 300 may include a first delay unit 310 that may receive the bank active signal BA_ACT, delay the received signal by a first delay time, and output the delayed signal, and second to fourth delay units 320 to 340 that may delay the output of the first delay unit 310 by a second delay time corresponding to a combination of the delay time selection signals TRIG_C, TRIG_B, and TRIG_A and output the delayed signal.

The first delay unit 310 may delay the bank active signal BA_ACT by the first delay time without being controlled by an external signal, and may include a resistor R and a capacitor C or an inverter chain corresponding to the first delay time.

The second to fourth delay units 320 to 340 may sequentially bypass the output of the first delay unit 310 according to the delay time selection signals TRIG_C, TRIG_B, and TRIG_A, or may delay the output of the first delay unit 310 and output the delayed signal. That is, when the delay time selection signals TRIG_C, TRIG_B, and TRIG_A are activated at a low level, the second to fourth delay units 320 to 340 may bypass input signals BA_ACT_d1, BA_ACT_d2, and BA_ACT_d3, respectively. When the delay time selection signals TRIG_C, TRIG_B, and TRIG_A are inactivated at a high level, the second to fourth delay units 320 to 340 may delay the input signals BA_ACT_d1, BA_ACT_d2, and BA_ACT_d3 by a predetermined amount of time, respectively, and output the delayed signals.

The second delay unit 320 may include: a first NAND gate ND11 that may receive the delay time selection signal TRIG_C and the output signal BA_ACT_d1 of the first delay unit 310; a delay element 321 that may receive the output of the first NAND gate ND11; a first inverter IV21 that may receive the delay time selection signal TRIG_C; a second NAND gate ND12 that may receive the output of the first inverter IV21 and the output signal BA_ACT_d1 of the first delay unit 310; and a third NAND gate ND13 that may receive the outputs of the delay elements 321 and the second NAND gate ND12 and output a delayed bank active signal BA_ACT_d2 to the next stage. The third and fourth delay units 330 and 340 may have the same structure as the second delay unit 320. The delay times of the first to fourth delay units 310 to 340 may be equal or not equal to one another according to the circuit design. The first to fourth delay units 310 to 340 may be designed such that the sum of the delay times of any two of the first to fourth delay units 310 to 340 is not less than the delay time of one of the other delay units.

The driving signal generating unit 20 and the sense amplifier driver 30 may have the same structure as those according to the related art shown in FIGS. 2 and 3, and thus a detailed description thereof will be omitted.

Figure 9:
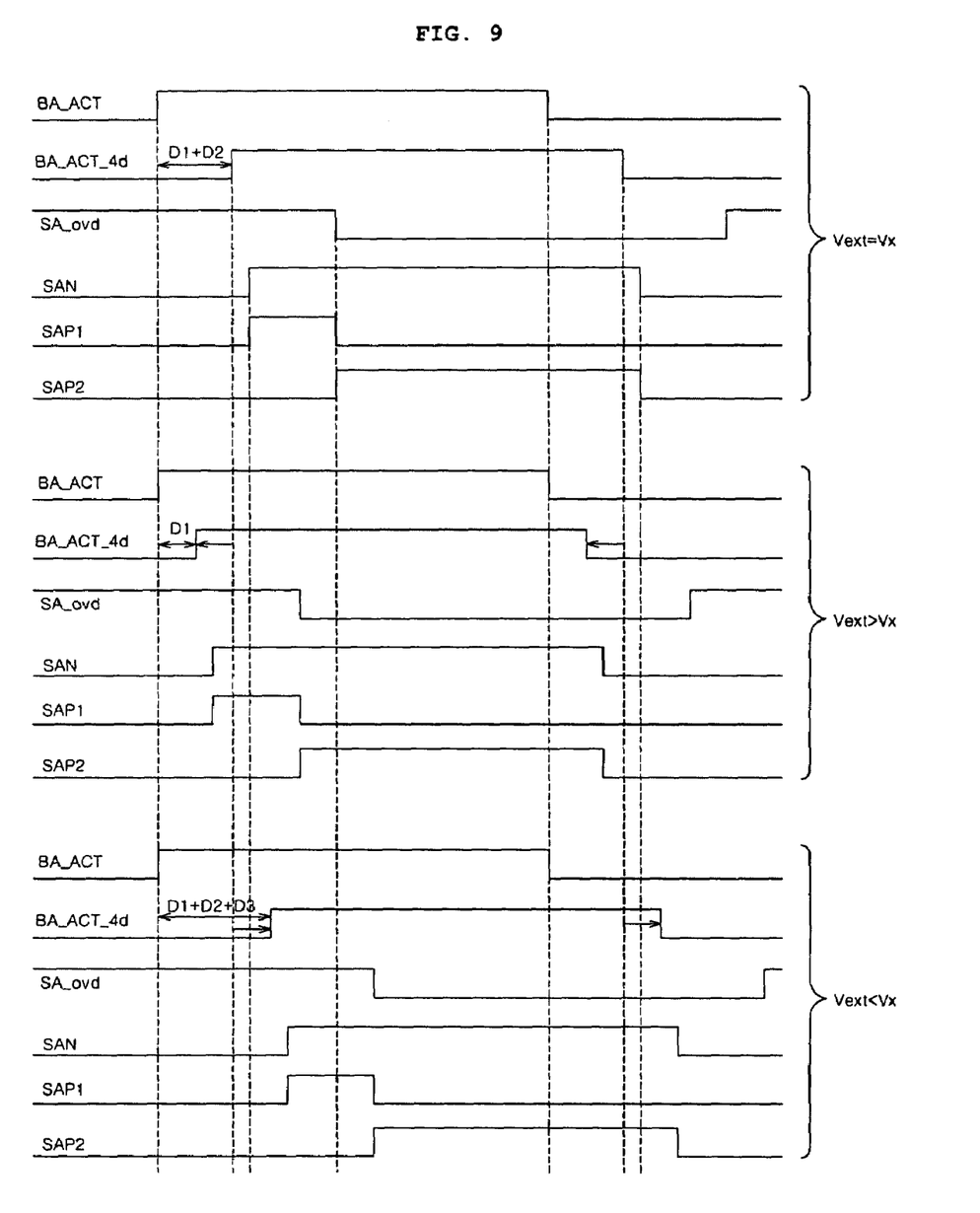
FIG. 9 is an exemplary timing chart illustrating the operation of the sense amplifier control circuit of the semiconductor memory apparatus according to one embodiment.

Next, the operation of the sense amplifier control circuit of the semiconductor memory apparatus according to one embodiment will be described with reference to FIG. 9.

First, the control unit 100 may use a plurality of reference voltages VREF_A, VREF_B, and VREF_C generated by the reference voltage generating unit 110 to detect a variation in the level of the external voltage Vext, control the delay time selection signal generator 120 to selectively activate a plurality of delay time selection signals TRIG_A, TRIG_B, and TRIG_C, and output the activated signals.

The delay time selection signal generator 120 may be designed such that, when the external voltage level Vext is equal to the reference level Vx, the first and second level detectors 121 and 122 shown in FIG. 7 may detect the reference voltages VREF_A and VREF_B among the plurality of reference voltages VREF_A, VREF_B, and VREF_C divided from the external voltage Vext, activate the respective delay time selection signals TRIG_A and TRIG_B at a low level, and output the activated signals. In this case, the delay time selection signal TRIG_A may be at a low level, the delay time selection signal TRIG_B may be at a low level, and the delay time selection signal TRIG_C may be at a high level.

For convenience of explanation, the delay times of the first to fourth delay units 310 to 340 are referred to as D1, D2, D3, and D4, respectively.

The delay element 321 of the second delay unit 320 shown in FIG. 8 may delay the signal BA_ACT_d1 that has been delayed by D1 through the first delay unit 310 by D2 to generate a signal BA_ACT_d2, and the second delay unit 320 may output the signal BA_ACT_d2. The third and fourth delay units 330 and 340 may bypass the signal BA_ACT_d2 without delay, and the fourth delay unit 340 may output a signal BA_ACT_d4. That is, the total delay time of the signal BA_ACT_d4 may be D1+D2. As shown in FIG. 9, the driving signal generating unit 20 may output driver driving signals SAN, SAP1, and SAP2 at the timing when the delayed signal BA_ACT_d4 is activated and the sense amplifier driver 30 may output sense amplifier driving signals RTO and SB to drive the sense amplifier 40.

The delay time D1+D2 may be equal to or similar to the delay time of the delay unit 10 shown in FIG. 1.

When the external voltage Vext is higher than the reference level Vx, the first and third level detectors 121 to 123 shown in FIG. 7 may detect the reference voltages VREF_A, VREF_B, and VREF_C divided from the external voltage Vext, and activate the respective delay time selection signals TRIG_A, TRIG_B, and TRIG_C at a low level. Then, the first and third level detectors 121 to 123 may output the activated signals. In this case, the delay time selection signal TRIG_A may be at a low level, the delay time selection signal TRIG_B may be at a low level, and the delay time selection signal TRIG_C may be at a low level.

The second to fourth delay units 320 to 340 shown in FIG. 8 may bypass the signal BA_ACT_d1 that has been delayed by D1 through the first delay unit 310 without a delay to generate a signal BA_ACT_d4, and the fourth delay unit 340 may output the signal BA_ACT_d4. The total delay time of the signal BA_ACT_d4 may be D1. As shown in FIG. 9, when the external voltage level Vext is equal to the reference level Vx, the driving signal generating unit 20 may output the driver driving signals SAN, SAP1, and SAP2 at the timing that leads the active timing of the delayed signal BA_ACT_d4 by D2, and the sense amplifier driver 30 may output the sense amplifier driving signals RTO and SB to drive the sense amplifier 40. In this way, it may be possible to operate the sense amplifier 40 at an appropriate timing by reducing the delay time even when the external voltage Vext increases, which may make it possible to stably sense exact data.

When the external voltage Vext is lower than the reference level Vx, the first level detector 121 shown in FIG. 7 may detect the reference voltage VREF_A among the reference voltages VREF_A, VREF_B, and VREF_C divided from the external voltage Vext, activate the delay time selection signal TRIG_A, and output the activated signal. In this case, the delay time selection signal TRIG_A may be at a low level, the delay time selection signal TRIG_B may be at a high level, and the delay time selection signal TRIG_C may be at a high level.

The second and third delay units 320 and 330 shown in FIG. 8 may delay the signal BA_ACT_d1 that has been delayed by D1 through the first delay unit 310 by D2 and D3, respectively, and the third delay unit 330 may output a signal BA_ACT_d3. The fourth delay unit 340 may bypass the signal BA_ACT_d3 without delay to generate a signal BA_ACT_d4, and output the signal BA_ACT_d4. The total delay time of the signal BA_ACT_d4 may be D1+D2+D3. As shown in FIG. 9, when the external voltage level Vext is equal to the reference level Vx, the driving signal generating unit 20 may output the driver driving signals SAN, SAP1, and SAP2 at the timing that delays the active timing of the delayed signal BA_ACT_d4 by D3, and the sense amplifier driver 30 may output the sense amplifier driving signals RTO and SB so as to drive the sense amplifier 40. In this way, it may be possible to operate the sense amplifier 40 with an appropriate timing by increasing the delay time even when the external voltage Vext decreases, which may make it possible to stably sense exact data.

As described above, according to one embodiment, a variation of the level of the external voltage Vext may be detected in order to adjust the delay time. However, the external voltage Vext may indicate only the voltage input from the outside of the semiconductor memory apparatus. A voltage Vperi used in a peripheral circuit area of the semiconductor memory apparatus may be used as the external voltage.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

In the method and circuit for controlling a sense amplifier of a semiconductor memory apparatus according to one embodiment, the sense amplifier is controlled such that stable and exact data sensing can be performed regardless of a variation in the level of the external voltage, which makes it possible to improve the performance of a semiconductor memory apparatus using the sense amplifier control circuit.

What is claimed is:

1. A sense amplifier control circuit of a semiconductor memory apparatus, comprising:
    a control unit adapted to detect a variation in a level of an external voltage by comparing a predetermined level with a plurality of reference voltages generated using the external voltage and output a delay time selection signal on the basis of a result of the detection;
    a variable delay unit adapted to receive a bank active signal and the delay time selection signal and delay the bank active signal by an increase or decreased delay time corresponding to the delay time selection signal and output a delayed bank active signal;
    a driving signal generating unit adapted to adjust activation timing of a driving signal according to the delayed bank active signal; and
    a sense amplifier driver adapted to drive a sense amplifier responding to an activation of the driving signal.

2. The sense amplifier control circuit of claim 1,
wherein the control unit includes;
    a reference voltage generator adapted to receive and divide the external voltage to output the plurality of reference voltages; and
    a delay time selection signal generator adapted receive the plurality of reference voltages and selectively activate a plurality of delay time selection signals according to levels of the plurality of reference voltages and output the activated signals.

3. The sense amplifier control circuit of claim 2,
wherein the reference voltage generator includes a plurality of resistors connected between an external voltage terminal and a ground terminal; and
the plurality of reference voltages are output from predetermined nodes between the resistors.

4. The sense amplifier control circuit of claim 3,
wherein the plurality of resistors have the same resistance value.

5. The sense amplifier control circuit of claim 2,
wherein the delay time selection signal generator includes a plurality of level detectors adapted to receive the plurality of reference voltages; and
the level detectors activate the delay time selection signals and output activated signals when the levels of the input reference voltages are equal to or higher than the predetermined level.

6. The sense amplifier control circuit of claim 5,
wherein each of the level detectors includes:
a plurality of first switching elements that are connected to an external voltage terminal;
a plurality of second switching elements that are connected between the first switching elements and a ground terminal and are adapted to be turned on according to the reference voltages; and
an output terminal adapted to output the delay time selection signal through a node between the first switching elements and the second switching elements.

7. The sense amplifier control circuit of claim 6,
wherein the first and second switching elements are comprised of transistors, and
the predetermined level depends on the sizes of the transistors.

8. The sense amplifier control circuit of claim 1,
wherein the variable delay unit includes:
a first delay unit adapted to receive the bank active signal, delay the bank active signal by a first delay time, and output the delayed bank active signal; and
second delay units adapted to receive the delay time selection signals by each signal bit respectively and an output of the first delay unit or an output of a previous second delay unit as in input signal, sequentially bypass or delay the input signal according to the each signal bit of the delay time selection signals, and output the delayed signal.

9. The sense amplifier control circuit of claim 8,
wherein the first delay unit includes a delay element corresponding to the first delay time.

10. The sense amplifier control circuit of claim 8,
wherein the second delay unit includes a plurality of delays adapted to receive the delay time selection signals and sequentially bypass or delay output signals of the first delay unit according to the delay time selection signals, and output the delayed signals.

11. The sense amplifier control circuit of claim 10,
wherein, when the delay time selection signals are activated, the plurality of delays bypass input signals; and when the delay time selection signals are inactivated, the plurality of delays delay the input signals by a predetermined amount of time and output the delayed signals.

12. The sense amplifier control circuit of claim 10, wherein each of the plurality of delays includes:
a first logic element adapted to receive the delay time selection signal and the output signal of the first delay unit;
a delay element adapted to receive an output signal of the first logic element;
a second logic element adapted to receive an inverted signal of the delay time selection signal and the output signal of the first delay unit; and
a third logic element adapted to receive output signals of the delay element and the second logic element and output the signals.

13. The sense amplifier control circuit of claim 12, wherein the first to third logic elements are NAND gates.

14. The sense amplifier control circuit of claim 10, wherein the delay times of the plurality of delays are different from each other.

15. The sense amplifier control circuit of claim 1, wherein the external voltage is a voltage supplied from the outside of the semiconductor memory apparatus or a voltage used in a peripheral area of the semiconductor memory apparatus.

16. A method of controlling a sense amplifier in a semiconductor memory apparatus, comprising:
detecting a level of an external voltage;
delaying a bank active signal by an increased or decreased time corresponding to a detection result of the external voltage level to obtain a delayed bank active signal; and
adjusting an activation timing of a driving signal for driving a sense amplifier on the basis of the delayed bank active signal, wherein the detecting of the level of the external voltage includes:
dividing the level of the external voltage to generate a plurality of reference voltages; and
comparing levels of the plurality of reference voltages with a predetermined level.

17. The method of claim 16, wherein the delaying of the bank active signal by the increased or decreased time corresponding to the detection result of the external voltage level includes:
comparing the level of the external voltage with a predetermined level, and increasing or decreasing a delay time to be larger or smaller than a reference delay time on the basis of the result of the comparison; and
delaying the bank active signal by the increased or decreased delay time.

18. The method of claim 17, wherein the increasing or decreasing of the delay time on the basis of the result of the comparison includes:
decreasing the delay time to be smaller than the reference delay time when the external voltage level is higher than the predetermined level; and
increasing the delay time to be larger than the reference delay time when the external voltage level is lower than the predetermined level.

19. The method of claim 16, wherein the external voltage is a voltage supplied from outside of the semiconductor memory apparatus or a voltage used in a peripheral area of the semiconductor memory apparatus.

\* \* \* \* \*